US007808267B2

(12) United States Patent
Lee et al.

(10) Patent No.: US 7,808,267 B2
(45) Date of Patent: Oct. 5, 2010

(54) MODULE AND METHOD FOR DETECTING DEFECT OF THIN FILM TRANSISTOR SUBSTRATE

(75) Inventors: Hong Woo Lee, Cheonan (KR); Myung Koo Hur, Cheonan (KR); Jong Hwan Lee, Anyang (KR); Sung Man Kim, Seoul (KR); Jong Hyuk Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/881,776

(22) Filed: Jul. 26, 2007

(65) Prior Publication Data

US 2008/0048709 A1 Feb. 28, 2008

(30) Foreign Application Priority Data

Jul. 28, 2006 (KR) ...................... 10-2006-0071426

(51) Int. Cl.
*G01R 31/00* (2006.01)

(52) U.S. Cl. ...................................................... 324/770

(58) Field of Classification Search .................. 324/770
See application file for complete search history.

(56) References Cited

U.S. PATENT DOCUMENTS 7,317,325 B2 * 1/2008 Brunner et al. ............. 324/770
2001/0045924 A1 11/2001 Huang
2003/0173991 A1 * 9/2003 Takafuji et al. ............. 324/770
2005/0012518 A1 * 1/2005 Lee ............................ 324/770
2005/0073335 A1 * 4/2005 Kim et al. ................... 324/770
2005/0270059 A1 * 12/2005 Ando ......................... 324/770
2006/0226866 A1 * 10/2006 Ando ......................... 324/770

FOREIGN PATENT DOCUMENTS

JP 8-334743 12/1996
JP 10-143118 5/1998
JP 2002-23683 1/2002
JP 2003-108102 4/2003
KR 2000-0075119 12/2000

(Continued)

OTHER PUBLICATIONS

English Language Abstract, Publication No. JP8334743, Dec. 17, 1996, 1 p.

(Continued)

*Primary Examiner*—Ha Tran T Nguyen
*Assistant Examiner*—Shaun Campbell
(74) *Attorney, Agent, or Firm*—Innovation Counsel LLP

(57) ABSTRACT

The present invention relates to a module and method for detecting a defect of a thin film transistor (TFT) substrate, which can detect disconnection of a gate line of the TFT substrate having gate drivers provided with a dual structure in which the gate drivers are provided at both sides of the gate lines. There is provided a module and method for detecting a defect of a TFT substrate, wherein gate lines are separated into two portions by cutting a central region of the gate lines, gate power is supplied to the gate lines of which central portions are cut through gate drivers provided at both sides of the gate lines, and a signal of a negative voltage level is supplied to data lines, so that disconnection of the gate lines can be detected.

20 Claims, 5 Drawing Sheets

FOREIGN PATENT DOCUMENTS

| | | |
|---|---|---|
| KR | 2003-0063928 | 7/2003 |
| KR | 2005-0065115 | 6/2005 |
| KR | 2005-0069101 | 7/2005 |
| KR | 2005-0089486 | 9/2005 |

OTHER PUBLICATIONS

English Language Abstract, Publication No. JP10143118, May 29, 1998, 1 p.

English Language Abstract, Publication No. JP2002023683, Jan. 23, 2002, 1 p.

English Language Abstract, Publication No. JP2003108102, Apr. 11, 2003, 1 p.

Korean Patent Abstracts, Publication No. 1020000075119, Dec. 15, 2000, 1 p.

Korean Patent Abstract, Publication No. 1020030063928, Jul. 31, 2003, 1 p.

Korean Patent Abstracts, Publication No. 1020050065115, Jun. 29, 2005, 1 p.

Korean Patent Abstracts, Publication No. 1020050069101, Jul. 5, 2005, 1 p.

Korean Patent Abstracts, Publication No. 1020050089486, Sep. 8, 2005, 1 p.

* cited by examiner

MODULE AND METHOD FOR DETECTING DEFECT OF THIN FILM TRANSISTOR SUBSTRATE

This application claims priority to Korean Patent application No. 10-2006-0071426, filed in the Korean Intellectual Property Office on Jul. 28, 2006, and all the benefits accruing therefrom under 35 U.S.C. §119, the contents of which is incorporated herein by reference in its entirety.

BACKGROUND

1. Technical Field

The present invention relates to a module and method for detecting a defect of a thin film transistor substrate. More particularly, the present invention relates to a module and method for detecting disconnection of a signal line of a thin film transistor substrate of a display panel.

2. Related Art

Liquid crystal display devices typically include a liquid crystal display panel for displaying an image thereon in accordance with an external control signal, and a driver for driving the liquid crystal display panel. The liquid crystal display panel may include a plurality of gate and data lines, a thin film transistor (TFT) substrate with TFTs and pixel electrodes provided thereon, and a common electrode substrate with a common electrode provided thereon.

In order to reduce the cost of such display devices, a gate driver may be connected to a plurality of gate lines and integrated on one side of the TFT substrate. To detect disconnection of gate lines during manufacture, gate power may be applied by the gate driver to the positions of the gate lines on one side (e.g., left side) of the disconnection region, but not to portions of the gate lines the other side (e.g., right side).

For large display devices, a single gate driver may not supply sufficient gate power to the gate lines. Accordingly, gate drivers may be integrated on two sides of the TFT substrate to supply gate power to the gate lines. However, the disconnection of gate lines cannot be easily detected for such structures during manufacture. For example, if gate drivers are positioned at both the left and right sides of gate lines, gate power may be applied to gate lines to the left of a disconnection by the gate driver positioned on the left side, and gate power may be applied to gate lines to the right of a disconnection by the gate driver positioned on the right side. Thus, if a gate line is disconnected, the gate power will nevertheless be applied to both sides of the gate lines and disconnection of the gate line cannot be easily detected.

SUMMARY

In accordance with various embodiments of the present invention, a module and method are provided to detect a defect of a thin film transistor (TFT) substrate. Such defects may include a disconnection of a gate line of a TFT substrate having dual gate drivers or a short between adjacent pixel electrodes.

In accordance with one embodiment of the present invention, a module is configured to detect a defect of a thin film transistor (TFT) substrate comprising a plurality of data lines, a plurality of gate lines, and a plurality of pixel electrodes. The module comprises: a data signal generator adapted to supply test data signals to the data lines; an operation signal generator adapted to supply an operation signal to first and second gate drivers, wherein each gate line is separated into a first portion connected with the first gate driver and a second portion connected with the second gate driver; and a detector adapted to measure a voltage level of at least one of the pixel electrodes.

The TFT substrate may comprise a first set of data pads connected to a first set of the data lines, a second set of data pads connected to a second set of the data lines, and first and second test pads connected to the first and second sets of data pads, respectively, wherein the data signal generator is adapted to generate first and second test data signals to be supplied to the first and second test pads, respectively. The data signal generator may comprise a plurality of output terminals configured as probes and adapted to supply the first and second test data signals to the first and second test pads, respectively.

The first and second test data signals may exhibit a negative voltage. Alternatively, the first and second test data signals may exhibit different voltage levels from each other.

The operation signal generator may be adapted to supply a start signal, a first clock signal, a second clock signal, and a ground signal to a start signal pad, a first clock signal pad, a second clock signal pad, and a ground signal pad of the TFT substrate, respectively. The operation signal generator may comprise a plurality of output terminals configured as probes and adapted to supply the start signal, the first clock signal, the second clock signal, and the ground signal to the start signal pad, the first clock signal pad, the second clock signal pad, and the ground signal pad, respectively.

The first and second gate drivers may comprise: a first plurality of stages connected to a first set of the gate lines and adapted to supply gate power to the first set of gate lines in response to the first clock signal; and a second plurality of stages connected to a second set of the gate lines and adapted to supply the gate power to the second set of gate lines in response to the second clock signal.

The start and ground signals may be provided by one signal. Each of the start and ground signals may comprise a single pulse. Alternatively, each of the start and ground signals may comprise a plurality of pulses. Each of the first and second clock signals may comprise a single pulse.

The operation signal generator may be adapted to supply the first and second clock signals simultaneously. In addition, the operation signal generator may be adapted to supply the start and ground signals simultaneously.

The operation signal generator may be adapted to supply the first clock signal and the second clock signal sequentially. The operation signal generator may be adapted to supply the first clock signal, the start signal, and the ground signal simultaneously, and further adapted to supply the second clock signal, the start signal, and the ground signal simultaneously.

The TFT substrate may comprise a plurality of TFTs at intersections of the gate lines and the data lines, and a plurality of pixel electrodes connected to the TFTs, wherein the TFTs are adapted to be turned on by gate power supplied to the gate lines in response to first and second clock signals, wherein the pixel electrodes are adapted to be charged with voltages of first and second test data signals through the TFTs.

The TFT substrate may comprise a plurality of TFTs at intersections of the gate lines and the data lines, and a plurality of pixel electrodes connected to the TFTs, wherein the TFTs are adapted to be turned on by gate power supplied to the gate lines in response to the first and second clock signals, wherein the pixel electrodes are adapted to be charged through the TFTs with voltages of the test data signals.

In accordance with another embodiment of the present invention, a method for detecting a defect of a thin film transistor (TFT) substrate is provided. The method comprises: providing a TFT substrate comprising: a plurality of gate lines, wherein each of the gate lines is separated into a first portion and a second portion, a plurality of data lines, a plurality of TFTs at intersections of the gate lines and the data lines, and a plurality of pixel electrodes connected to the TFTs; supplying gate power to the gate lines; supplying a data signal exhibiting a negative voltage to the data lines; and detecting a voltage of at least one of the pixel electrodes.

The supplying gate power may comprise simultaneously supplying the gate power to the first and second portions of the gate lines. The supplying gate power may be performed in response to a clock signal and an operation signal by: a first plurality of stages connected to the first portion of the gate lines; and a second plurality of stages connected to the second portion of the gate lines. Each of the operation and clock signals may comprise a single pulse. The method may further comprise simultaneously supplying the operation and clock signals to the first and second stages.

The supplying gate power may be performed by: a first plurality of stages connected to a first set of the gate lines and adapted to supply gate power to the first set of gate lines in response to a first clock signal and a plurality of operation signals; and a second plurality of stages connected to a second set of the gate lines and adapted to supply gate power to the second set of gate lines in response to a second clock signal and the operation signals. The operation signals may comprise a start signal and a ground signal.

In accordance with another embodiment of the present invention, a method for detecting a defect of a thin film transistor (TFT) substrate is provided. The method comprises: providing a TFT substrate comprising: a plurality of gate lines, wherein each of the gate lines is separated into a first portion and a second portion, a plurality of data lines, a plurality of TFTs at intersections of the gate lines and the data lines, and a plurality of pixel electrodes connected to the TFTs; supplying gate power to a first set of the gate lines; supplying a first voltage to a first set of the data lines; supplying a second voltage a second set of the data lines; supplying the gate power to a second set of the gate lines; supplying the second voltage to the first set of the data lines; supplying the first voltage to the second set of data lines; and detecting a voltage of at least one of the pixel electrodes.

The first voltage may be a positive voltage and the second voltage may be a negative voltage.

BRIEF DESCRIPTION OF THE DRAWINGS

The above and other features and advantages of various embodiments of the present invention will become apparent from the following description given in conjunction with the accompanying drawings, in which.

DETAILED DESCRIPTION

Figure 1:
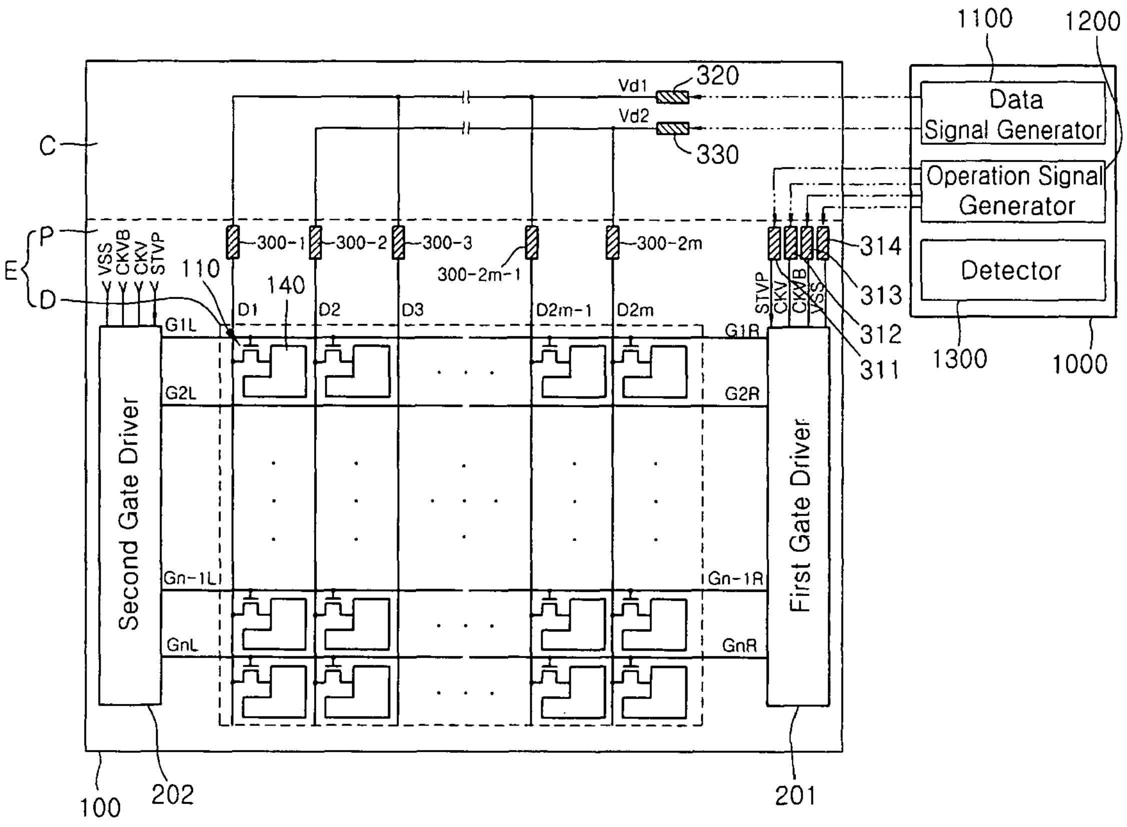
FIG. 1 is a conceptual view illustrating a system for detecting a defect of a thin film transistor (TFT) substrate according to an embodiment of the present invention.

Hereinafter, embodiments of the present invention will be described in detail with reference to the accompanying drawings. However, the present invention is not limited to the embodiments described below but may be implemented in a variety of forms. The disclosed embodiments are provided only for illustrative purposes and for full understanding of the scope of the present invention to those skilled in the art. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "lower", "under," "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The technology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings. Referring to FIGS. 1 to 6, an embodiment of a system for detecting a defect of a TFT substrate 100 comprises a plurality of gate lines G1R to GnR and G1L to GnL, a plurality of data lines D1 to D2*m*, a plurality of TFTs 110, a plurality of pixel electrodes 140, and a detection module 1000. TFT substrate 100 comprises first and second gate drivers 201 and 202 and other appropriate components formed thereon. The detection module 1000 comprises a data signal generator 1100 for supplying first and second test data signals Vd1 and Vd2 to the plurality of data lines D1 to D2*m* of the TFT substrate 100; an operation signal generator 1200 for respectively supplying operation signals STVP, CKV, CKVB and VSS to the first and second gate drivers 201 and 202 of the TFT substrate 100; and a detector 1300 for detecting voltages of the pixel electrodes 140.

TFT substrate 100 includes a cut-away region C and an element region E. Element region E includes a display region D and a peripheral region P. Gate lines G1R to GnR and G1L to GnL are formed in display region D and extend in a first direction. Data lines D1 to D2*m* are also formed in display region D and extend in a second direction, TFTs 110 and pixel electrodes 140 are formed at the intersections of the gate lines G1R to GnR and G1L to GnL and the data lines D1 to Dm. First and second gate drivers 201 and 202, a plurality of data pads 300-1 to 300-2*m*, and operation signal pads 311, 312, 313 and 314 are formed in peripheral region P. A plurality of test pads 320 and 330 in cutaway region C are connected to the plurality of data pads 300-1 and 300-2*m*.

Each of the plurality of gate lines is separated into a left gate line portion and a right gate line portion with respect to the approximate center of the display region D. For example, the first gate line is separated into a first R gate line G1R and a first L gate line G1L. Accordingly, as shown in FIG. 1, the first to n-th R gate lines G1R to GnR are provided to the right the center of the display region D, while the first to n-th L gate lines G1L to GnL are provided to the left of the center of the display region D.

Portions of the first to n-th R gate lines G1R to GnR extend to the peripheral region P to be connected to the first gate driver 201. Portions of the first to n-th L gate lines G1L to GnL also extend to the peripheral region P to be connected to the second gate driver 202. Thus, gate power Von is sequentially applied to the first to n-th R gate lines G1R to GnR through the first gate driver 201, while gate power Von is sequentially applied to the first to n-th L gate lines G1L to GnL through the second gate driver 202.

In one embodiment, the first to n-th R gate lines G1R to GnR and the first to n-th L gate lines G1L to GnL have the same length. In another embodiment, a ratio of the length of the first to n-th R gate lines G1R to GnR to the first to n-th L gate lines G1L to GnL may be in a range of approximately 3:1 to approximately 1:3. The ratio may vary depending on the length of outputs of the first and second drivers 201 and 202 connected to the gate lines G1R to GnR and G1L to GnL. For example, where outputs of the first and second gate drivers 201 and 202 are the same length, length ratio of the first to n-th R gate lines G1R to GnR and the first to n-th L gate lines G1L to GnL may be approximately 1:1.

Gate lines G1R to GnR and G1L to GnL and data lines D1 to D2*m* intersect with each other within the display region D. As described above, because the gate lines include left and right portions, one half of the plurality of data lines D1 to D2*m* may intersect with the first to n-th R gate lines G1R to GnR, and the other half of the plurality of D1 to D2*m* may intersect with the first to n-th L gate lines G1L to GnL. Portions of the data lines D1 to D2*m* further extend to the peripheral region P to be connected to data pads 300-1 to 300-2*m*, respectively.

Each TFT 110 comprises a gate electrode 111 connected to one of gate lines G1R to GnR and G1L to GnL, a source electrode 115 connected to one of data lines D1 to D2*m*, and a drain electrode 116 connected to one of pixel electrodes 140. A gate insulation film 112, an active layer 113, and an ohmic contact layer 114 are provided between the gate electrode 111 and the source and drain electrodes 115 and 116. Accordingly, the TFTs 110 operate depending on the gate power Von supplied to the gate lines G1R to GnR and G1L to GnL and thus may supply signals of the data lines D1 to D2*m* to the pixel electrodes 140.

As described above, the first and second drivers 201 and 202 are respectively connected to the first to n-th R gate lines G1R to GnR and the first to n-th L gate lines G1L to GnL. Further, the first and second drivers 201 and 202 respectively supply the gate power Von sequentially to the first to n-th R gate lines G1R to GnR and to the first to n-th L gate lines G1L to GnL in accordance with external operation signals which may include a start signal STVP, a first clock signal CKV, a second clock signal CKVB, and a ground signal VSS.

Figure 2:
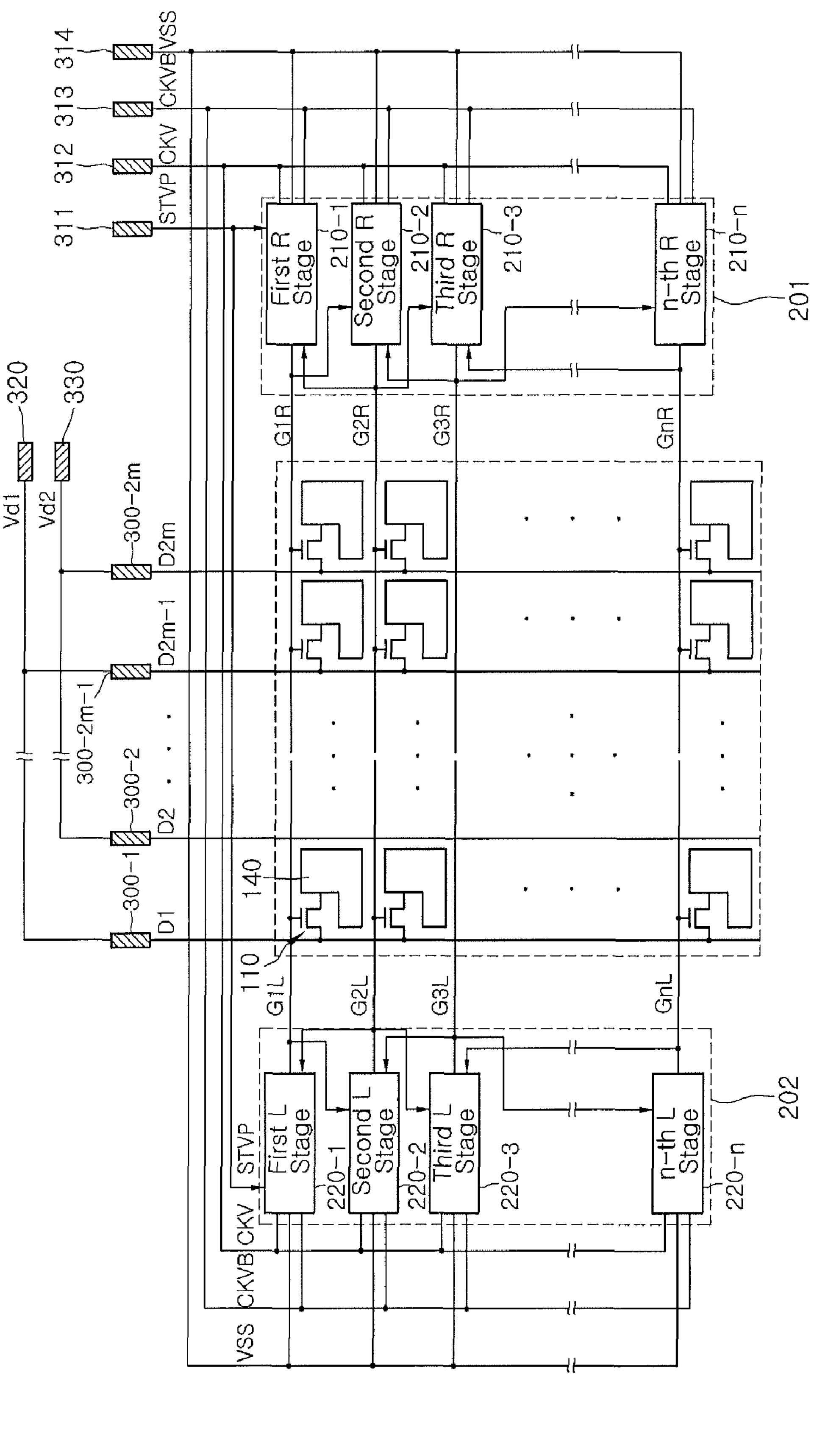
FIG. 2 is a plan view conceptually illustrating a TFT substrate according to an embodiment of the present invention.

The operation signal pads include a start signal pad 311, a first clock signal pad 312, a second clock signal pad 313, and a ground signal pad 314. Operation signal pads 311, 312, 313, and 314 are formed in a region adjacent to the first gate driver 201 as shown in FIGS. 1 and 2. In one embodiment, the first and second drivers 201 and 202 are electrically connected to the operation signal pads through predetermined conductive lines. In another embodiment, pairs of the operation signal pads may be connected to the first and second drivers 201 and 202, respectively.

During normal operation, the first and second drivers 201 and 202 may supply the gate power Von sequentially to gate lines G1R to GnR and G1L to GnL in accordance with the start signal STVP, the first clock signal CKV, the second clock signal CKVB, and the ground signal VSS supplied through the start signal pad 311, the first clock signal pad 312, the second clock signal pad 313, and the ground pad 314, respectively. During testing, the first and second drivers 201 and 202 may supply the gate power Von simultaneously to gate lines G1R to GnR and G1L to GnL in accordance with the start signal STVP, the first clock signal CKV, the second clock signal CKVB, and the ground signal VSS.

As shown in FIG. 2, the first and second drivers 201 and 202 comprise a plurality of stages 210-1 to 210-*n* and 220-1 to 220-*n*, respectively. The first gate driver 201 comprises the first to n-th R stages 210-1 to 210-*n* respectively connected to the first to n-th R gate lines G1R to GnR. The second gate driver 202 comprises first to n-th L stages 220-1 to **220-*n*** respectively connected to the first to n-th L gate lines G1L to GnL.

The first R and L stages 210-1 and 220-1 respectively supply the gate power Von to the first R and L gate lines G1R and G1L in accordance with the start signal STVP, the first clock signal CKV, the second clock signal CKVB, and the ground signal VSS. The second to n-th R stages 210-2 to **210-*n* respectively supply the gate power Von to the second to n-th R gate lines G2R to GnR in accordance with the gate power Von that is the output of the previous stages 210-1 to 210-*n*-1, the first clock signal CKV, the second clock signal CKVB, and the ground signal VSS. The second to n-th L stages 220-2 to 220-*n* respectively supply gate power Von to the second to n-th L gate lines G2L to GnL in accordance with gate power Von that is the output of the previous stages 220-1 to 220-*n*-1, the first clock signal CKV, the second clock signal CKVB, and the ground signal VSS. Here, the first to (n−1)-th R stages 210-1 to 210-*n*-1 and the first to (n−1)-th L stages 220-1 to 220-*n*-1 are reset in accordance with the gate power Von that is output by the next stages. In one embodiment, the n-th R stage 210-*n* and n-th L stage 220-*n* may be reset in accordance with a reset signal that may be used as start signal STVP. In another embodiment, an additional dummy stage is provided so that the n-th R and n-th L stages 210-*n* and 220-*n*** may be reset using the output of the dummy stage.

The odd-numbered stages among the aforementioned first to n-th R and L stages 210-1 to **210-*n* and 220-1 to 220-*n*** output the gate power Von in a logic high interval of the first clock signal CKV, and the even-numbered stages output the gate power in a logic high interval of the second clock signal CKVB.

The operation of the first and second gate drivers 201 and 202 during a normal operation will be described in detail below with reference to FIG. 2. A case where the start signal STVP, the first clock signal CKV, the second clock signal CKVB, and the ground signal VSS are respectively applied through the start signal pad 311, the first clock signal pad 312, the second clock signal pad 313, and the ground signal pad 314 will be as follows. The start signal STVP is supplied to the first R and L stages 210-1 and 220-1. The first clock signal CKV, the second clock signal CKVB, and the ground signal VSS are supplied to the first to n-th R stages 210-1 to **210-*n* and the first to n-th L stages 220-1 to 220-*n***.

The first R and L stages 210-1 and 220-1 are driven by the start signal STVP to supply the gate power Von to the first R and L gate lines G1R and G1L, respectively, during the logic high interval of the first clock signal CKV. Gate power Von may be approximately equal to the voltage of the first clock signal CKV in a logic high state. In this regard, the first clock signal CKV in the logic high state may be used as the gate power Von. Thereafter, the gate power Von of the first R and L stages 210-1 and 220-1 are supplied to the second R and L stages 210-2 and 220-2, respectively. The second R and L stages 210-2 and 220-2 are driven by the gate power Von of the first R and L stages 210-1 and 220-1 and thus supply the gate power Von to the second R and L gate lines G2R and G2L, respectively, in the logic high interval of the second clock signal CKVB. At this time, it is preferred that the gate power be identical with the voltage of the second clock signal CKVB in the logic high state. That is, it is preferred that the second clock signal CKVB in the logic high state be used as the gate power Von. Here, a reversed signal of the first clock signal CKV may be used as the second clock. The voltage signal CKVB of the first and second clock signals CKV and CKVB in the logic high state may be substantially identical with each other. Thus, the gate power Von supplied to the odd- or even-numbered gate lines may have the same voltage.

Next, the gate power Von, which is the output of the second R and L stages 210-2 and 220-2, is supplied to the first R and L stages 210-1 and 220-1 and the third R and L stages 210-3 and 220-3, respectively. The first R and L stages 210-1 and 220-1 are reset in accordance with the gate power Von of the second R and L stages 210-2 and 220-2 to supply the ground signal VSS to the first R and L gate lines G1R and G1L, respectively. The third R and L stages 210-3 and 220-3 are driven by the gate power Von of the second R and L stages 210-2 and 220-2 to supply the gate power Von to the third R and L gate lines G3R and G3L, respectively, in the logic high interval of the first clock signal CKV. The gate power Von, which is the output of the third R and L stages 210-3 and 220-3, is supplied to the fourth R and L stages 210-4 and 220-4.

As such, the plurality of stages 210-1 to **210-*n* and 220-1 to 220-*n*** are sequentially driven in accordance with the start signal STVP, the gate power Von that is the output of the previous stages, the first clock signal CKV, the second clock signal CKVB, and the ground signal VSS to supply the gate power Von to the plurality of gate lines G1R to GnR and G1L to GnL, respectively, in a normal operation.

The first test pad 320 is connected to the odd-numbered data pads 300-1 to **300-2*m*-1 among the data pads 300-1 to 300-2*m* provided in the peripheral region P, and the second test pad 330 is connected to the even-numbered data pads 300-2 to 300-2*m*. The first test pad 320 supplies the first test data signal Vd1 to the odd-numbered data lines D1 to D2*m*-1 of the display region D through the odd-numbered data pads 300-1 to 300-2*m*-1. The second test pad 330 supplies the second test data signal Vd2 to the even-numbered data lines D2 to D2*m* of the display region D through the even-numbered data pads 300-2 to 300-2*m*. Alternatively, the first and second test pads 320 and 330** may be formed as one pad.

Detection module 1000 may be used to detect defects in the aforementioned TFT substrate 100 by supplying the test operation signals to the start signal pad 311, the first clock signal pad 312, the second clock signal pad 313, and the ground signal pad 314, by supplying the first and second test data signals Vd1 and Vd2 to the first and second test pads 310 and 330.

The data signal generator 1100 generates the first and second test data signals Vd1 and Vd2 through appropriate first and second output terminals (not shown). The first output terminal is electrically connected to the first test pad 320, and the second output terminal is electrically connected to the second test pad 330. In one embodiment, the first and second output terminals are implemented as probes. Accordingly, the data signal generator 1100 supplies the first test data signal Vd1 to the odd-numbered data lines D1 to D**2*m*-1, and supplies the second test data signal Vd2 to the even-numbered data lines D2 to D2*m*. In one embodiment, each of the first and second test data signals Vd1 and Vd2 may be implemented using voltage higher or lower by approximately 1 to approximately 2 times than that used during normal operation. In this embodiment, in order to detect disconnection of the gate lines G1R to GnR and G1L to GnL, it is preferred that negative voltage signals be used as the first and second test data signals Vd1 and Vd2. For example, in a case where the voltage of a data signal supplied to the data lines in a normal operation is in a range of 0 to 10V, the data signal generator 1100** according to this embodiment preferably supplies a voltage in a range of −10 to 20V.

The operation signal generator 1200 generates the start signal STVP, the first clock signal CKV, the second clock signal CKVB, and the ground signal VSS through appropriate first to fourth output terminals (not shown). The first output terminal is electrically connected to the start signal pad 311 and provides the start signal STVP to the start signal pad 311. The second output terminal is electrically connected to the first clock signal pad 312 and provides the first clock signal CKV to the first clock signal pad 312. The third output terminal is electrically connected to the second clock signal pad 313 and provides the second clock signal CKVB to the second clock signal pad 313. The fourth output terminal is electrically connected to the ground signal pad 314 and provides the ground signal VSS to the ground signal pad 314. In one embodiment, the first to fourth output terminals are implemented as probes.

Preferably, the start signal STVP and the ground signal VSS are the same signal. In one embodiment, stages 210-1 to 210-*n* and 220-1 to 220-*n* within the first and second drivers 201 and 202 comprise a plurality of TFTs (not shown). Here, the TFTs connected to the gate lines G1R to GnR and G1L to GnL provide the first or second clock signal CKV or CKVB as the gate power Von to the gate lines G1R to GnR and G1L to GnL. In this embodiment, the start signal STVP and the ground signal VSS are supplied as the same signal, so that the TFTs connected to the gate lines G1R to GnR and G1L to GnL within the plurality of stages 210-1 to 210-*n* and 220-1 to 220-*n* are turned on. Accordingly, the gate power Von may be simultaneously supplied to the plurality of gate lines G1R to GnR and G1L to GnL in accordance with the first and second clock signals CKV and CKVB.

In one embodiment, the first and second clock signals CKV and CKVB may be implemented by a single pulse signal with a logic high interval. The gate power Von is supplied to the odd-numbered gate lines through the odd-numbered stages in the logic high interval of the first clock signal CKV, and the gate power Von is supplied to the even-numbered gate lines through the even-numbered stages in the logic high interval of the second clock signal CKVB.

The operation signal generator 1200 according to this embodiment may variously change the pulse widths of the start signal STVP, the ground signal VSS, and the first and second clock signals CKV and CKVB. That is, it is possible to vary the widths (pulse widths) of the intervals in which signals exhibit a logic high state. Further, the signal voltage in the logic high state may be variable. For example, during normal operation, the operation signal generator 1200 may generate a voltage higher or lower by 1 to 2 times the voltages of the start signal STVP, the first clock signal CKV, the second clock signal CKVB, and the ground signal VSS. Accordingly, it is possible to control the operation of the plurality of stages 210-1 to 210-*n* and 220-1 to 220-*n*, and to variously change the voltage level of the gate power Von supplied to the plurality of gate lines G1R to GnR and G1L to GnL.

The detector 1300 checks the voltage states of the pixel electrodes 140 by connecting to or approaching the plurality of pixel electrodes 140 of the TFT substrate 100 to check a voltage level of pixel electrode 140. Accordingly, it is possible to detect a pixel electrode with a voltage level different from pixel electrodes adjacent thereto.

Figure 3:
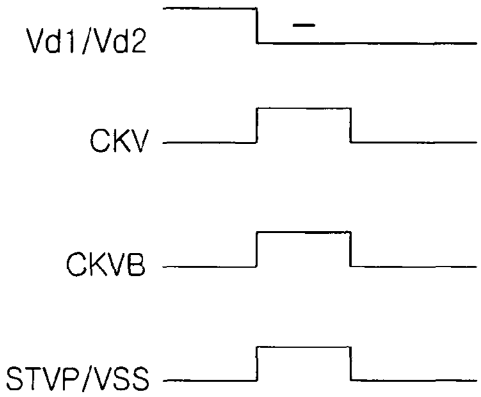
FIG. 3 is an output waveform diagram of a detection module for detecting disconnection of a gate line according to an embodiment of the present invention.
Figure 4:
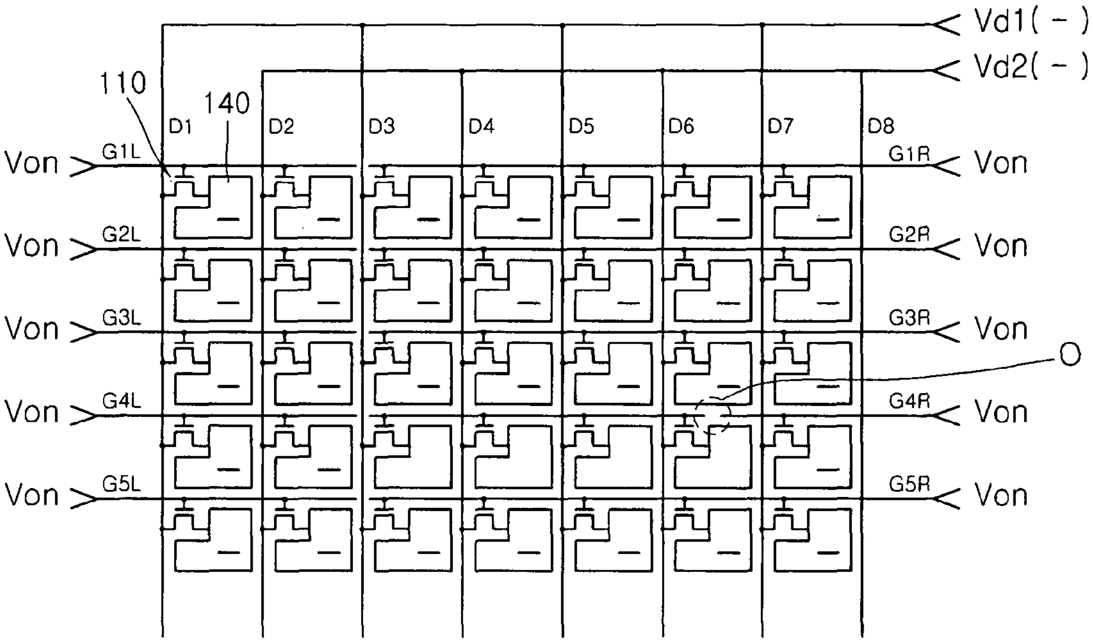
FIG. 4 is a conceptual view illustrating a method for detecting disconnection of a gate line according to an embodiment of the present invention.

Hereinafter, a method for detecting disconnection of the gate lines G1R to GnR and G1L to GnL of the TFT substrate 100 using the detection module provided with the aforementioned structure will be described. As shown in FIG. 3, the detection module 1000 drives the plurality of stages 210-1 to 210-*n* and 220-1 to 220-*n* of the first and second gate drivers 201 and 202 by supplying the start signal STVP and the ground signal VSS to the stages 210-1 to 210-*n* and 220-1 to 220-*n*. At this time, the operation signal generator 1200 also supplies the first and second clock signals CKV and CKVB to the plurality of stages 210-1 to 210-*n* and 220-1 to 220-*n*. Accordingly, the odd-numbered stages apply the gate power Von to the odd-numbered gate lines by means of the first clock signal CKV, and the even-numbered stages apply the gate power Von to the even-numbered gate lines by means of the second clock signal CKVB. In this embodiment, the first and second clock signals CKV and CKVB are simultaneously applied as shown in FIG. 3. Accordingly, it is possible to apply the gate power Von to all the gate lines G1R to GnR and G1L to GnL through the stages 210-1 to 210-*n* and 220-1 to 220-*n*. The gate power Von applied to gate lines G1R to GnR and G1L to GnL is supplied to the gate electrodes 111 of TFTs 110 thereby turning on TFTs 110. Alternatively, it is possible to sequentially supply the gate power Von to the plurality of gate lines G1R to GnR and G1L to GnL.

Meanwhile, the detection module 1000 supplies the first test data signal Vd1 and the second test data signal Vd2 to the odd-numbered data lines D1 to D2*m*-1 and the even-numbered data lines D2 to D2*m*, respectively, through the data signal generator 1100. In this embodiment, the same signal with the same negative voltage is used as the first and second test data signals Vd1 and Vd2, as shown in FIG. 3. Accordingly, a data signal with a negative voltage (−) is simultaneously supplied to all the data lines D1 to D2*m*.

At this time, TFTs 110 are turned on, so that the data signal of the data lines D1 to D2*m* is supplied to pixel electrodes 140 through TFTs 110, as described above. Pixel electrodes 140 are charged with the data signal of a negative voltage (−) in the logic high interval of the first and second clock signals CKV and CKVB. Thus, if there is no disconnection of the gate lines G1R to GnR and G1L to GnL, all pixel electrodes 140 are charged with a negative voltage (−).

In FIGS. 3 to 6, a portion (a disconnection line) of the fourth R gate line G4R is shown to be disconnected. Specifically, a disconnection line running from a disconnection region O to an end portion of the fourth R gate line G4R is floating. As a result, the gate power Von of the fourth R stage 210-4 will not be supplied to the disconnected portion. Further, the fourth gate line is divided into the fourth L gate line G4L and the fourth G gate line G4R with respect to the central portion of the display region D. Thus, the gate power Von of the fourth L stage 220-4 will not be supplied to the fourth R gate line G4R.

Figure 5:
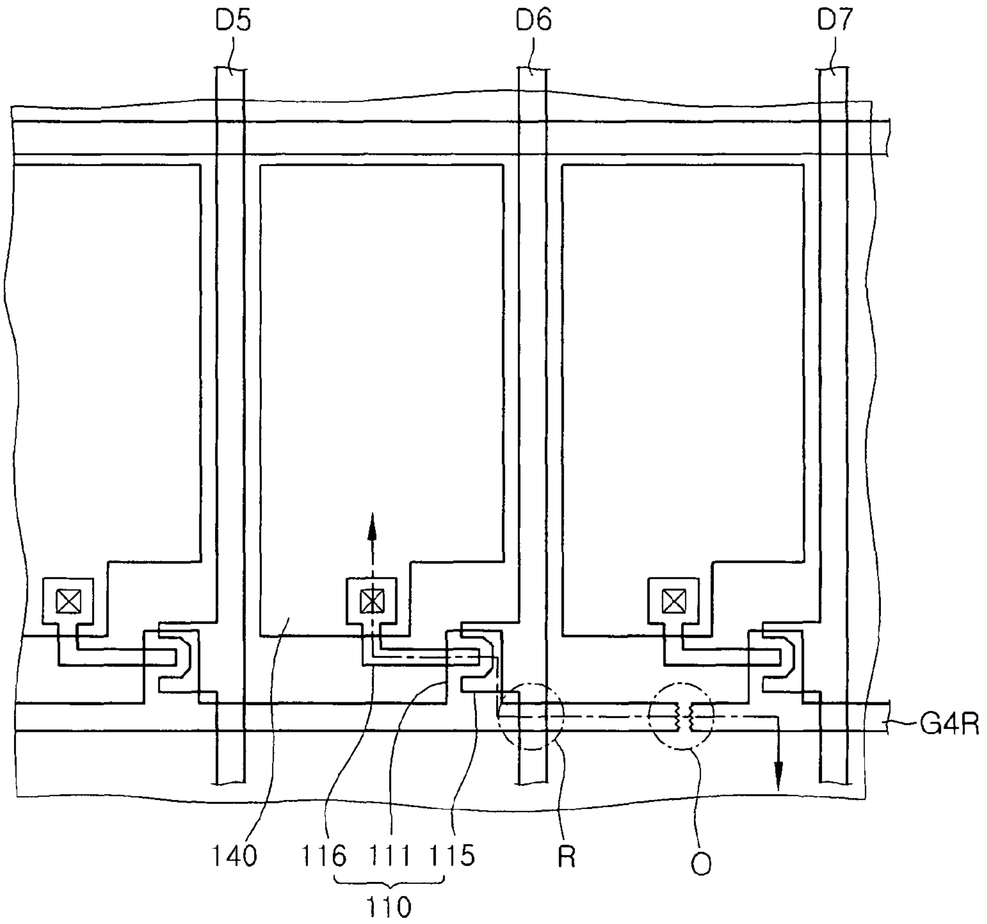
FIG. 5 is a detailed plan view of the TFT substrate conceptually illustrating a principle of the method for detecting a defect of a gate line according to an embodiment of the present invention.
Figure 6:
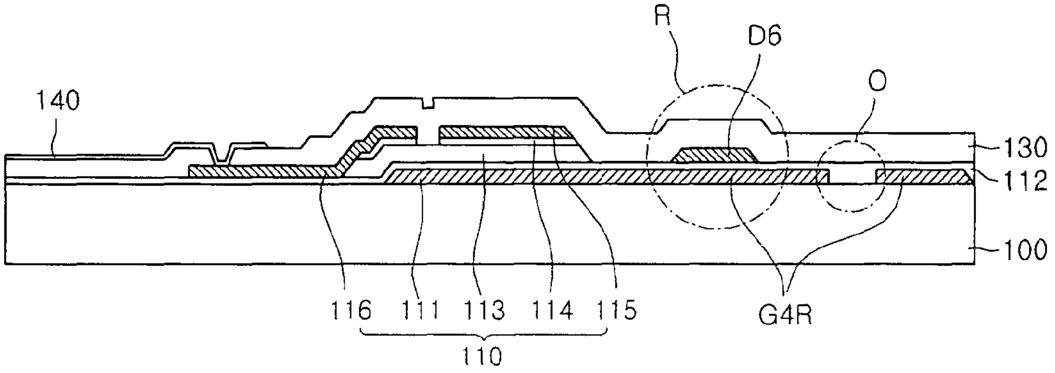
FIG. 6 is a sectional view taken along line A-A in FIG. 5.

The voltage of the floating disconnection line varies depending on the voltage of the fourth to sixth data lines D4 to D6, which overlap with the disconnection line. As shown in FIGS. 5 and 6, a predetermined capacitor is formed in the overlapping region R of the floating disconnection line and the sixth data line D6. The disconnection line is an electrode of the capacitor and the sixth data line D6 is the other electrode thereof.

Here, in a case where an electrode of the capacitor is floating, the voltage of the electrode varies in correspondence with the voltage variation of the other electrode due to a coupling effect. For example, the voltage of the floating electrode rises by 10V when the voltage of the other electrode rises from 0 to 10V, while the voltage of the floating electrode falls by −10V when the voltage of the other electrode falls from 0 to −10V.

Thus, when the first and second test data signals Vd1 and Vd2 with a negative voltage are supplied to the first to eighth data lines D1 to D8 as described above, the voltage of the floating disconnection line is changed into a negative voltage (−). Therefore, the negative voltage (−) is supplied to the gate electrode 111 of the TFT 110 connected to the floating disconnection line, so that the TFT 110 is turned off. Accordingly, the TFT 110 is not operated, so that the pixel electrodes 140 connected to the disconnection line are not charged with the negative voltage (−). The voltage of first and second test data signals Vd1 and Vd2 may range from a negative voltage (−) up to a voltage in which the TFT 110 remains turned off. Where a negative voltage is used for the first and second test data signals Vd1 and Vd2, defect detection can be improved.

Thereafter, the voltage states of the pixel electrodes are detected through the detector 1300, thereby detecting disconnection of the gate lines G1R to GnR and G1L to GnL. That is, if a pixel electrode region which is not discharged with the negative voltage (−) is detected, it can be easily seen that one of the gate lines G1R to GnR and G1L to GnL connected to the pixel electrode region is disconnected. The negative voltage (−) is induced to the disconnection line to allow the TFT 110 connected thereto not to be driven. As a result, gate line disconnection can be precisely determined.

Figure 7:
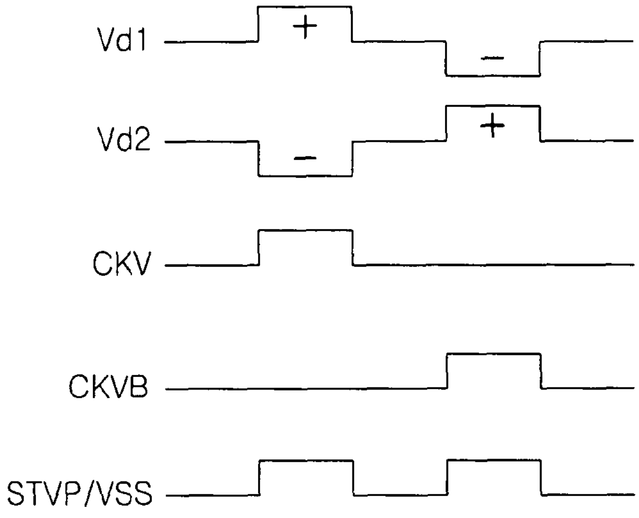
FIG. 7 is an output waveform diagram of a detection module for detecting disconnection between pixel electrodes according to an embodiment of the present invention.
Figure 8:
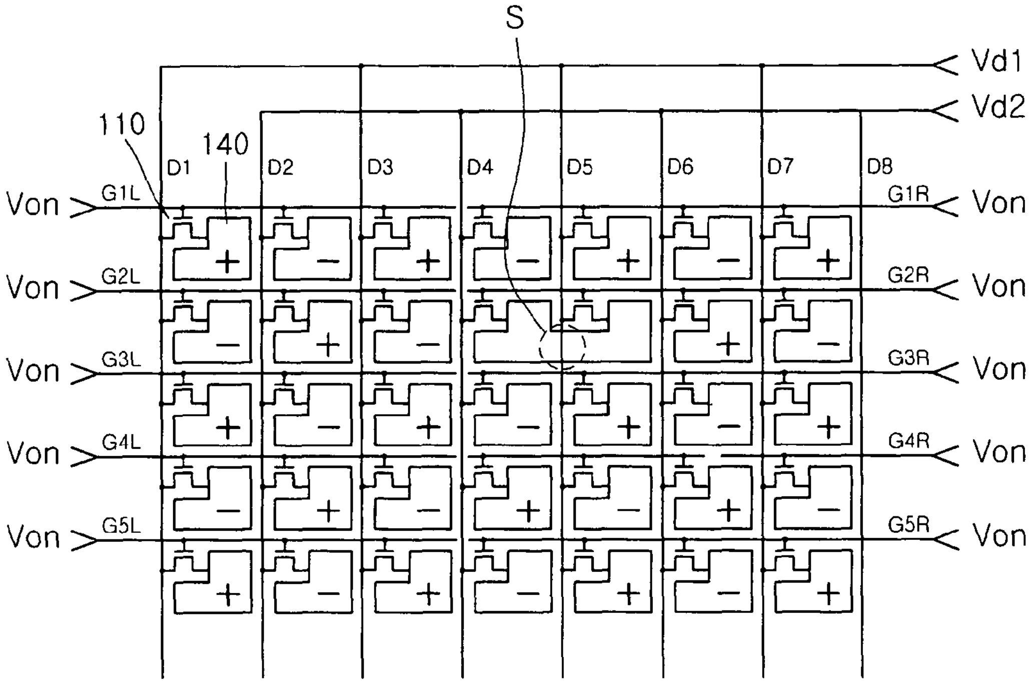
FIG. 8 is a conceptual view illustrating a method for detecting disconnection between pixel electrodes according to an embodiment of the present invention.

The detection module 1000 may also be used to detect shorts between adjacent pixel electrodes 140. FIG. 7 is an output waveform diagram of a detection module for detecting disconnection between adjacent pixel electrodes according to the embodiment of the present invention, and FIG. 8 is a conceptual view illustrating a method for detecting disconnection between pixel electrodes according to the embodiment of the present invention.

As described above, the output terminals of the detection module 1000 are connected to the pads of the TFT substrate 100. As shown in FIG. 7, the operation signal generator 1200 of the detection module 1000 supplies the start signal STVP and the ground signal VSS to the plurality of stages 210-1 to 210-*n* and 220-1 to 220-*n* of the first and second drivers 201 and 202, and a first clock signal CKV in the logic high is applied to the odd-numbered stages of stages 210-1 to 210-*n* and 220-1 to 220-*n*, thereby supplying the gate power Von to the odd-numbered gate lines connected to the odd-numbered stages. The start signal STV and the ground signal VSS may use a signal with the same waveform. As a result, the TFTs 110 connected to the odd-numbered gate lines are turned on. Meanwhile, the data signal generator 1100 of the detection module 1000 supplies the first test data signal Vd1 with a positive voltage (+) to the odd-numbered data lines D1 to D2$m$-1, and supplies the second test data signal Vd2 with a negative voltage (−) to the even-numbered data lines D2 to D2$m$. The corresponding pixel electrodes 140 are charged with the positive voltage (+) by the TFTs 110 connected to the odd-numbered data lines D1 to D2$m$-1 among the TFTs 110 turned on, and the corresponding pixel electrodes 140 are charged with the negative voltage (−) by the TFTs 110 connected to the even-numbered data lines D2 to D2$m$. All the signals are then reset.

Thereafter, the operation signal generator 1200 supplies the start signal STVP and the ground signal VSS to the plurality of stages 210-1 to 210-*n* and 220-1 to 220-*n*, and the second clock signal CKVB in the logic high is applied to the even-numbered stages 210-1 to 210-*n* and 220-1 to 220-*n* thereby supplying the gate power Von to the even-numbered gate lines connected to the even-numbered stages. Accordingly, the TFTs 110 connected to the even-numbered gate lines are turned on. Meanwhile, the data signal generator 1100 supplies the first test data signal Vd1 with a negative voltage (−) to the odd-numbered data lines D1 to D2$m$-1, and supplies the second test data signal Vd2 with a positive voltage (+) to the even-numbered data lines D2 to D2$m$. Accordingly, the corresponding pixel electrodes 140 are charged with the negative voltage (−) by the TFTs 110 connected to the odd-numbered data lines D1 to D2$m$-1 among the TFTs 110 turned-on, and the corresponding pixel electrodes 140 are charged with the positive voltage (+) by the TFTs 110 connected to the even-numbered data lines D2 to D2$m$.

The voltages between adjacent pixel electrodes 140 have different polarity through such a voltage application method. However, in a case where adjacent electrodes 140 are shorted as shown in a region S of FIG. 8, the voltage polarity between the pixel electrodes 140 may offset each other. Accordingly, a voltage level different form the aforementioned positive voltage (+) and negative voltage (−) is generated in a pixel electrode region in which the short occurs. For example, when voltages of +10 and −10V are respectively used as the positive voltage (+) and the negative voltage (−), the normal pixel electrodes 140 are charged with +10V or −10V. However, when two adjacent pixel electrodes 140 are shorted, the two pixel electrodes 140 are charged with 0V.

The voltage polarity and voltage level of the pixel electrodes 140 provided in the display region D of the TFT substrate 100 are measured by the detector 1300 of this embodiment, so that the short of the pixel electrodes 140 can be easily detected. Accordingly, defects of the pixel electrodes 140 adjacent above, below, left and right can be detected.

As described above, various embodiments of the present invention may provide gate lines separated into two portions. Stages provided at both sides of the gate lines may be driven in order to detect disconnection of the gate lines. Such detection may be enhanced by supplying negative voltages to the data lines. In another embodiment, gate power may be sequentially supplied to odd- and even-numbered gate lines, and signals with voltage polarities opposite to each other may be supplied to odd- and even-numbered data lines to detect defects of adjacent pixel electrodes.

Although the present invention has been described in connection with the accompanying drawings and the preferred embodiment, the present invention is not limited thereto but defined by the appended claims. Accordingly, it will be understood by those skilled in the art that various modifications and changes can be made thereto without departing from the spirit and scope of the invention defined by the appended claims.

What is claimed is:

1. A substrate-testing module configured to detect a possible defect in a manufactured and under-test thin film transistor (TFT) substrate, where said TFT substrate-under-test (TSUT) includes a plurality of successive data lines extending adjacent one to the next, a plurality of gate lines in respective gate line regions and crossing with the data lines, and a plurality of pixel electrodes each driven by a respective TFT switching device that is responsive to control and drive signals respectively provided on a corresponding gate line and data line, where each gate line region of the TSUT includes at least first and second co-linear sub-gate lines that are manufactured for not connecting to each other, where the TSUT includes a first gate driver coupled to drive the first sub-gate lines but not the second sub-gate lines and a second gate driver coupled to drive the second sub-gate lines but not the first sub-gate lines, the substrate-testing module comprising:

a data signal generator adapted to supply test data signals to the data lines;

an operation signal generator adapted to supply operation signals to the first and second gate drivers; and an electrical detector adapted to electrically measure respective voltage levels of at least two adjacent ones of the pixel electrodes after the data signal generator has supplied corresponding test data signals to the data lines of the at least two adjacent pixel electrodes and the operation signal generator has supplied operation signals to the first and second gate drivers so as to activate the respective TFT switching devices of the at least two adjacent pixel electrodes.

2. The module of claim 1, wherein the TFT substrate comprises a first set of data pads connected to a first set of the data lines, a second set of data pads connected to a second set of the data lines, and first and second test pads connected to the first and second sets of data pads, respectively, wherein the data signal generator is adapted to generate first and second test data signals to be supplied to the first and second test pads, respectively.

3. The module of claim 2, wherein the data signal generator comprises a plurality of output terminals configured as probes and adapted to supply the first and second test data signals to the first and second test pads, respectively.

4. The module of claim 2, wherein the first and second test data signals exhibit a negative voltage.

5. The module of claim 2, wherein the first and second test data signals exhibit different voltage levels from each other.

6. The module of claim 1, wherein the operation signal generator is adapted to supply a start signal, a first clock signal, a second clock signal, and a ground signal to a start signal pad, a first clock signal pad, a second clock signal pad, and a ground signal pad of the TFT substrate, respectively.

7. The module of claim 6, wherein the operation signal generator comprises a plurality of output terminals configured as probes and adapted to supply the start signal, the first clock signal, the second clock signal, and the ground signal to the start signal pad, the first clock signal pad, the second clock signal pad, and the ground signal pad, respectively.

8. The module of claim 6, wherein the first and second gate drivers respectively comprise:

a first plurality of shift register stages connected to a first set of the sub-gate lines and adapted to supply gate power to the first set of gate lines in response to the first clock signal; and a second plurality of shift register stages connected to a second set of the sub-gate lines and adapted to supply the gate power to the second set of gate lines in response to the second clock signal.

9. The module of claim 6, wherein the start and ground signals are provided by one signal.

10. The module of claim 6, wherein each of the start and ground signals comprises a single pulse.

11. The module of claim 6, wherein each of the start and ground signals comprises a plurality of pulses.

12. The module of claim 6, wherein each of the first and second clock signals comprises a single pulse.

13. The module of claim 6, wherein the operation signal generator is adapted to supply the first and second clock signals simultaneously.

14. The module of claim 13, wherein the operation signal generator is adapted to supply the start and ground signals simultaneously.

15. The module of claim 6, wherein the operation signal generator is adapted to supply the first clock signal and the second clock signal sequentially.

16. The module of claim 15, wherein the operation signal generator is adapted to supply the first clock signal, the start signal, and the ground signal simultaneously, and further adapted to supply the second clock signal, the start signal, and the ground signal simultaneously.

17. The module of claim 2, wherein the TFT substrate comprises a plurality of TFTs at intersections of the sub-gate lines and the data lines, and a plurality of pixel electrodes connected to the TFTs, wherein the TFTs are adapted to be turned on by gate power supplied to the sub-gate lines in response to first and second clock signals, wherein the pixel electrodes are adapted to be charged with voltages of first and second test data signals through the TFTs.

18. The module of claim 1, wherein:

successive data lines are enumerable as odd numbered data lines and even numbered data lines; and the data signal generator is adapted to simultaneously supply first test data signals to the odd numbered data lines and to simultaneously supply different second test data signals to the even numbered data lines.

19. A substrate-testing module configured to detect a possible defect in a manufactured and under-test thin film transistor (TFT) substrate, where said TFT substrate-under-test (TSUT) includes a plurality of successive data lines extending adjacent one to the next, the successive data lines being enumerable as odd numbered data lines and even numbered data lines and the TSUT further includes a plurality of gate lines crossing with the data lines and driven by first and second gate drivers of the TSUT, and a plurality of pixel electrodes each driven by a respective TFT switching device that is responsive to control and drive signals respectively provided on a corresponding gate line and data line, the substrate-testing module comprising:

a data signal generator adapted to supply test data signals to the data lines;

an operation signal generator adapted to supply operation signals to the first and second gate drivers; and an electrical detector adapted to electrically measure respective voltage levels of at least two adjacent ones of the pixel electrodes after the data signal generator has supplied corresponding test data signals to the data lines of the at least two adjacent pixel electrodes and the operation signal generator has supplied operation signals to the first and second gate drivers so as to activate the respective TFT switching devices of the at least two adjacent pixel electrodes, where the data signal generator is adapted to simultaneously supply first test data signals to the odd numbered data lines and to simultaneously supply different second test data signals to the even numbered data lines.

20. The substrate-testing module of claim 19 wherein:

the TFT substrate-under-test (TSUT) includes a sacrificial substrate portion that provides simultaneous connection of the first test data signals to the odd numbered data lines and simultaneous connection of the second test data signals to the even numbered data lines; and the data signal generator is adapted to connect to the sacrificial substrate portion when supplying the first and second test data signals simultaneously and respectively to the first and second data lines;

and wherein said sacrificial substrate portion is removable from the TSUT after testing is complete while leaving the TSUT operational.

* * * * *